(12) United States Patent
Kim et al.

(10) Patent No.: US 9,312,167 B1
(45) Date of Patent: Apr. 12, 2016

(54) AIR-GAP STRUCTURE FORMATION WITH ULTRA LOW-K DIELECTRIC LAYER ON PECVD LOW-K CHAMBER

(71) Applicant: Applied Materials, Inc., Santa Clara, CA (US)

(72) Inventors: Taewan Kim, San Jose, CA (US); Kang Sub Yim, Palo Alto, CA (US); Alexandros T. Demos, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/505,731

(22) Filed: Oct. 3, 2014

(51) Int. Cl.
| | |
|---|---|
| *H01L 21/76* | (2006.01) |
| *H01L 21/764* | (2006.01) |
| *H01L 21/02* | (2006.01) |
| *H01L 29/06* | (2006.01) |

(52) U.S. Cl.
CPC .......... *H01L 21/764* (2013.01); *H01L 21/0217* (2013.01); *H01L 21/02274* (2013.01); *H01L 29/0649* (2013.01)

(58) Field of Classification Search
CPC .................................................. H01L 21/7682
See application file for complete search history.

(56) References Cited

U.S. PATENT DOCUMENTS

| | | | |
|---|---|---|---|
| 6,077,767 A | 6/2000 | Hwang | |
| 6,423,629 B1 | 7/2002 | Ahn et al. | |
| 6,903,002 B1 | 6/2005 | Ben-Tzur et al. | |
| 7,256,127 B2 * | 8/2007 | Gallagher et al. | B81B 7/0006 257/E21.573 |
| 8,476,758 B2 | 7/2013 | Lin | |
| 2012/0261788 A1 * | 10/2012 | Lin et al. | H01L 21/31127 257/506 |

* cited by examiner

*Primary Examiner* — Daniel Whalen
(74) *Attorney, Agent, or Firm* — Patterson & Sheridan, LLP

(57) ABSTRACT

Methods for reducing the k value of a layer using air gaps and devices produced by said methods are disclosed herein. Methods disclosed herein can include depositing a carbon containing stack over one or more features in a substrate, depositing a porous dielectric layer over the carbon containing stack, and curing the substrate to volatilize the carbon containing stack. The resulting device includes a substrate with one or more features formed therein, a porous dielectric layer formed over the features with an air gap formed in the features.

16 Claims, 5 Drawing Sheets

AIR-GAP STRUCTURE FORMATION WITH ULTRA LOW-K DIELECTRIC LAYER ON PECVD LOW-K CHAMBER

BACKGROUND

1. Field

Embodiments disclosed herein generally relate to methods of forming low dielectric constant materials. More specifically, embodiments disclosed herein relate to the formation of air gaps between adjacent features on substrates.

2. Description of the Related Art

Semiconductor device geometries have dramatically decreased in size since their introduction several decades ago. Modern semiconductor fabrication equipment is routinely used to produce devices having geometries as small as 28 nm and less, and new equipment designs are continually being developed and implemented to produce devices with even smaller geometries. As device geometries decrease, the impact of interconnect capacitance on device performance increases. To reduce interconnect capacitance, inter-layer materials that have traditionally been formed of silicon oxide are being formed using lower dielectric constant materials (low k materials). Some low k materials that have been used include fluorinated silicon oxide, carbonated silicon oxide, and various polymers and aerogels. Use of these low k materials often presents serious reliability, manufacturability, and/or integration challenges.

One of the challenges is filling spaces between adjacent raised features (e.g., trenches and/or metal lines) with the low k materials. This is becoming more difficult as device geometries decrease and aspect ratios increase. The low k materials often pinch off at a top before the spaces completely fill leaving voids. In smaller spaces, the low k materials may completely pinch off at the top sealing the voids. In larger spaces, the low k material may not completely pinch off at the top thus leaving openings into the voids. Because semiconductor devices include both smaller and larger spaces, shapes of the voids are difficult to control. This leads to additional reliability and/or integration challenges.

Thus, there is a continuing need for lower k values in low k materials as used in semiconductor devices.

SUMMARY

Embodiments disclosed herein include devices with air gaps formed in conjunction with low-k dielectric films and methods of making the same. In one embodiment, a method of forming air gaps can include depositing a carbon containing material stack in one or more features of a substrate, forming a silicon containing film over the carbon containing material stack using a flowable plasma enhanced chemical vapor deposition (PECVD) process with a silicon precursor, the silicon containing film forming over an exposed portion of the upper surface and an exposed portion of the side walls; and curing the carbon containing material stack and the silicon containing film to form an air gap in the features and pores in the silicon containing film, wherein the hydrocarbon material is substantially removed during the cure such that at least one air gap extends between two of the sides walls and to the bottom surface of the feature. The stack deposition can include depositing a carbon containing material over a substrate, the substrate having an upper surface and one or more features formed thereon, the features having side walls, a bottom surface, wherein the carbon containing material is formed over the upper surface, the side walls and the bottom surface; stripping the carbon containing material from the upper surface and the side walls; and repeating the deposition of the carbon containing material and the stripping of the carbon-containing material to create a carbon containing material stack, the carbon containing material stack filling the features to a desired fill level.

In another embodiment, a device can include a substrate having an upper surface; a conductive layer formed on the upper surface of the substrate, the conductive layer having a feature formed therein, the feature having sidewalls and a bottom surface; a barrier layer formed conformally on the conductive layer; a porous dielectric layer formed over the upper surface; and an air gap formed between the sidewalls of the feature, the bottom surface of the feature and the porous dielectric layer, the barrier layer formed over the bottom surface of the feature and the sidewalls of the feature being substantially exposed to the air gap.

In another embodiment, a method of forming air gaps can include depositing a carbon containing material stack in one or more features of a substrate, the substrate having a conductive layer with an upper surface, the features being formed in the conductive layer and having sidewalls and a bottom surface; stripping the carbon-containing material stack from the upper surface of the substrate; forming a porous silicon nitride film over the upper surface of the substrate and the carbon containing material using a flowable plasma enhanced chemical vapor deposition (PECVD) process with a silicon precursor, the silicon nitride film forming over an exposed portion of the upper surface and an exposed portion of the side walls; and curing the carbon containing material stack and the silicon nitride film to form an air gap in the features and pores in the silicon containing material, wherein the carbon containing material stack is substantially removed during the cure such that at least one of the air gaps extend from a first one of the adjacent raised features to a second one of the adjacent raised features.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments disclosed herein include devices including an air gap low k dielectric and methods of producing the same. The air gap low k dielectric layer is a cost effective method of reducing the k-value of a resulting device. One or more features receive a carbon containing material which is volatilized after the formation of an overlying porous low k layer. The resulting structure has a k value which is reduced by the effective k value of air, which has a k value approximately equal to 1. The embodiments of the devices and systems are more clearly described with reference to the figures below.

Processing chambers that may be used to deposit flowable layers in accordance with embodiments of the present disclosure may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples include the CENTURA ULTIMA® HDP-CVD chambers/systems, and PRODUCER® PECVD chambers/systems, available from Applied Materials, Inc. of Santa Clara, Calif.

Figure 1:
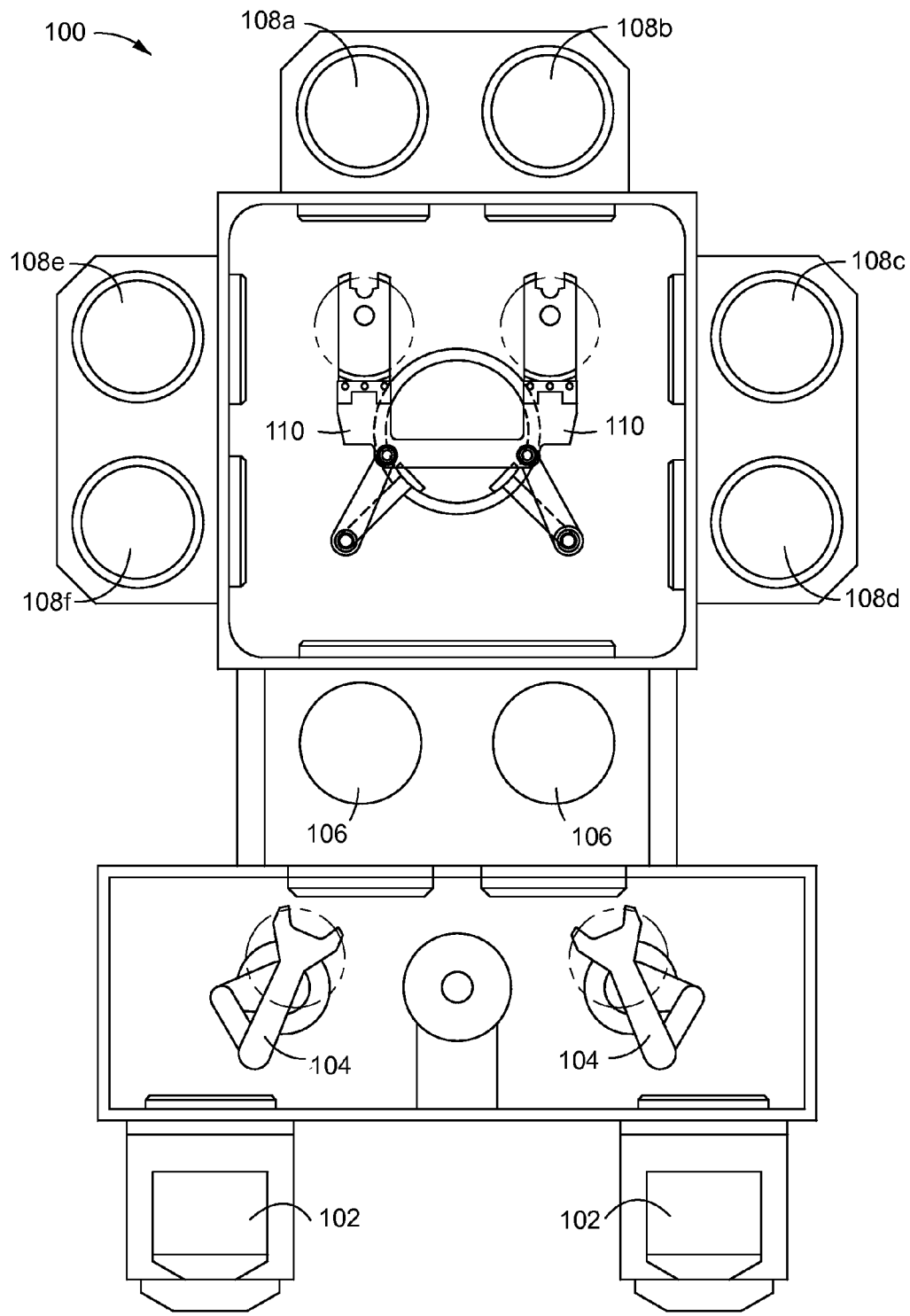
FIG. 1 is a overhead view of one embodiment of a processing system, according to one embodiment.

The processing chambers may be incorporated into larger fabrication systems for producing integrated circuit chips. FIG. 1 shows one such system 100 of deposition, baking, and curing chambers. In the figure, a pair of FOUPs (front opening unified pods) 102 supply, substrates (e.g., 300 mm diameter wafers) that are received by robotic arms 104 and placed into a low pressure holding area 106 before being placed into one of the wafer processing chambers 108a-108f. A second robotic arm 110 may be used to transport the substrate wafers from the holding area 106 to the processing chambers 108a-108f and back.

The processing chambers 108a-108f may include one or more system components for depositing, annealing, curing, and/or etching a flowable dielectric film on the substrate wafer. In one configuration, two pairs of the processing chamber (e.g., 108c and 108d and 108e and 108f) may be used to deposit the flowable dielectric material on the substrate, and the third pair of processing chambers (e.g., 108a and 108b) may be used to anneal the deposited dielectric. In another configuration, the same two pairs of processing chambers (e.g., 108c and 108d and 108e and 108f) may be configured to both deposit and anneal a flowable dielectric film on the substrate, while the third pair of chambers (e.g., 108a and 108b) may be used for UV or E-beam curing of the deposited film. In still another configuration, all three pairs of chambers (e.g., 108a-108f) may be configured to deposit and cure a flowable dielectric film on the substrate. In yet another configuration, two pairs of processing chambers (e.g., 108c-108d and 108e-108f) may be used for both deposition and UV or E-beam curing of the flowable dielectric, while a third pair of processing chambers (e.g. 108a and 108b) may be used for annealing the dielectric film. Any one or more of the processes described may be carried out on chamber(s) separated from the fabrication system shown in different embodiments.

In addition, one or more of the process chambers 108a-108f may be configured as a wet treatment chamber. These process chambers include heating the flowable dielectric film in an atmosphere that includes moisture. Thus, embodiments of system 100 may include wet treatment chambers 108a and 108b and anneal processing chambers 108c and 108d to perform both wet and dry anneals on the deposited dielectric film.

Figure 2:
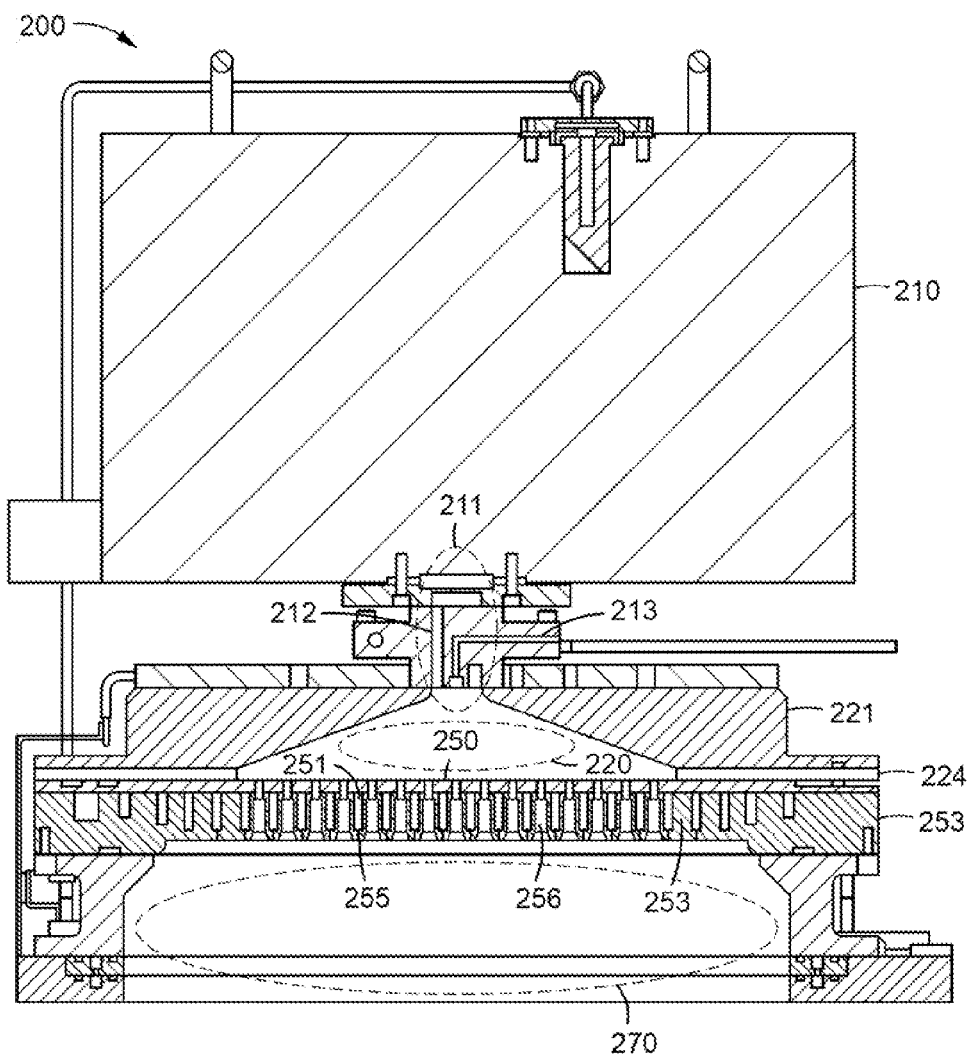
FIG. 2 is a schematic cross-sectional view of one embodiment of a process chamber, according to one embodiment.

FIG. 2 is a substrate processing chamber 200 according to one embodiment. A remote plasma system 210 may process a gas which then travels through a gas inlet assembly 211. Two distinct gas supply channels are visible within the gas inlet assembly 211. A first channel 212 carries a gas that passes through the remote plasma system 210, which a second channel 213 bypasses the remote plasma system 210. A lid 221 and a showerhead 253 are shown with an insulating ring 224 in between, which allows an AC potential to be applied to the lid 221 relative to showerhead 253. The process gas travels through first channel 212 into a chamber plasma region 220 and may be excited by a plasma in the chamber plasma region 220 alone or in combination with the remote plasma system 210. The combination of the chamber plasma region 220 and/or the remote plasma system 210 may be referred to as a remote plasma system herein. The argon and oxygen-containing gas may be transformed to argon and oxygen-containing plasma effluents by the remote plasma system. The showerhead 253 separates the chamber plasma region 220 from a substrate processing region 270 beneath the showerhead 253. The showerhead 253 allows a plasma present in the chamber plasma region 220 to avoid directly exciting gases in the substrate processing region 270, which still allowing excited species, such as the plasma effluents, to travel from the chamber plasma region 220 into the substrate processing region 270.

The showerhead 253 may be a dual-zone showerhead that allows plasma effluents, such as argon and oxygen-containing plasma effluents created within the plasma region 220 into the substrate processing region 270 by passing through a plurality of throughholes 256 that traverse the thickness of the showerhead 253. Each throughhole 256 may have an opening 250 facing the plasma region 220, and the opening 250 may have a smaller diameter than the diameter of the throughhole 256. The showerhead 253 also has one or more hollow volumes 251 which can be filled with a precursor in the form of a vapor or gas (such as the carbon-containing precursor gas) and pass through small holes 255 into the substrate processing region 270 but not directly into plasma region 220.

In the example shown, showerhead 253 may distribute (via throughholes 256) process gases which contain oxygen, hydrogen, nitrogen, and/or plasma effluents of such process gases upon excitation by a plasma in chamber plasma region 220. In some embodiments, the process gas introduced into the RPS 210 and/or chamber plasma region 220 through first channel 212 may contain one or more of oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen ($N_2$), etc. The second channel 213 may also deliver a process gas, a carrier gas, and/or a film-curing gas used to remove an unwanted component from the growing or as-deposited film. Plasma effluents may include ionized or neutral derivatives of the process gas and may also be referred to herein as a radical-oxygen precursors and/or a radical-nitrogen precursor referring to the atomic constituents of the process gas introduced.

The number of throughholes 256 may be between about 60 and about 2000. Throughholes 256 may have a variety of shapes but are mostly easily made round. The diameter of the opening 250 may be between about 0.5 mm and about 20 mm or between about 1 mm and about 6 mm. There is also latitude in choosing the cross-sectional shape of throughholes 256, which may be made conical, cylindrical or a combination of the two shapes. The number of small holes 255 used to introduce a gas into the substrate processing region 270 may be between about 100 and about 5000 or between about 500 and about 2000 in different embodiments. The diameter of the small holes 255 may be between about 0.1 mm and about 2 mm.

Figure 3A:
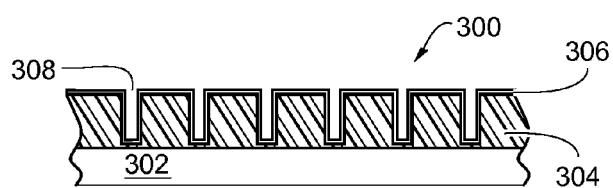
FIGS. 3A-3G depicts a device including an air gap low k film at various processing stems, according to one embodiment.

FIGS. 3A-3G are simplified cross-sectional drawings illustrating a device 300 during the formation of an air gap low k film. FIG. 3A depicts a device 300 prior to formation of the low k layer, according to one embodiment. The device 300 includes a substrate 302, a first layer 304 and a second layer 306. The first layer 304 may be a conductive layer, such as a copper layer. The second layer 306 may be a barrier layer. The device 300 can further have one or more features 308. The features 308 may be formed in the first layer 304, in the substrate 302 or both. The features 308 may be metal lines on a surface of the substrate 302, conductive lines overlaying devices formed in or on the substrate 302, trenches formed in an upper portion of the substrate 302 or the first layer 304, or the like. The device 300 may be a portion of or a component of semiconductor devices, such as flat panel displays (such as TFTs), energy conversion and storage devices (e.g., photovoltaic or fuel cells), solid-state lighting (e.g., LEDs and OLEDs), magnetic and optical storage devices, micro-electro-mechanical systems (MEMS), and the like.

Figure 3B:
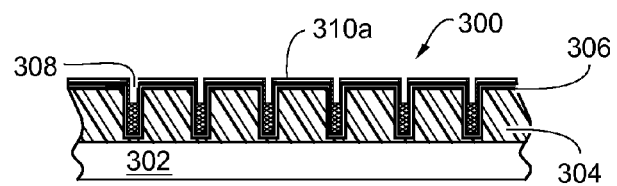

FIG. 3B shows a carbon-containing material 310a formed between the features 308 of the device 300. In this example, the carbon-containing material 310a is an amorphous carbon material. The carbon-containing material 310a may be formed using a flowable plasma enhanced chemical vapor deposition (PECVD) process as described more fully below. The carbon-containing material 306 may include primarily carbon, and hydrogen. As shown in this figure, the carbon-containing material 306 may fill a bottom region between adjacent raised features. When the carbon-containing material 306 is formed using a flowable deposition process, the carbon-containing material 306 fills the features 308 from a bottom upward, as well as covering the side walls and the tops portions of the features 308. The features 308 are filled to a level that is approximately the same regardless of the width or shape of the feature 308.

Figure 3C:
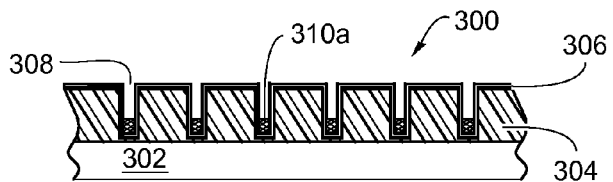

FIG. 3C shows the device 300 after removal of a portion of the carbon containing material 310a. The carbon containing material 310a can be removed from the upper surface of the second layer 306, as well as from the side walls of features 308 using a stripping process as described more fully below. The stripping process may include exposure to an oxygen-containing atmosphere at an elevated temperature, where the oxygen reacts with carbon in the carbon containing material 310a to provide carbon dioxide and water. After the stripping process, the carbon containing material 310a remains at the bottom of the feature 308.

Figure 3D:
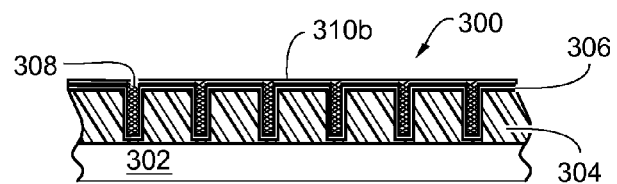

FIG. 3D shows the device 300 with a carbon-containing material 310b formed between the features 308 and over the carbon-containing material 310a. As above, the carbon-containing material 310b is depicted here as an amorphous carbon material and may be formed using a flowable plasma enhanced chemical vapor deposition (PECVD) process.

Figure 3E:
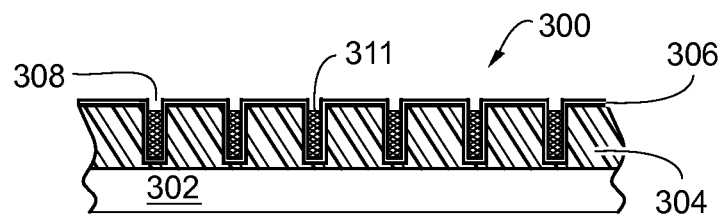

FIG. 3E shows the device 300 after removal of a portion of the carbon containing material 310b. As above, the carbon containing material 310b can be removed from the upper surface of the second layer 306, as well as from the side walls of features 308 using a stripping process. After the stripping process, the carbon containing material 310a and 310b remain at the bottom of the feature 308, creating a carbon containing material stack 311. One or more cycles of deposition and stripping can be used to create the carbon containing material stack 311. The carbon containing material stack 311 can be deposited to an end point based on the desired height of the final stack or based on maximum fill of the feature 308.

Figure 3F:
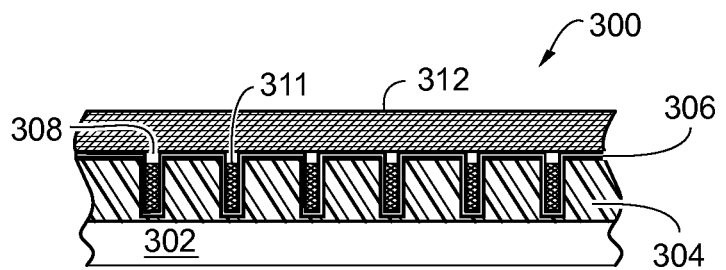

FIG. 3F shows a silicon-containing film 312 formed over the carbon containing material stack 311. The silicon-containing film 312 may be formed using a flowable CVD process as described more fully below. The silicon-containing film 312 may fill an upper region between the features 308 and extend over the features 308. In an embodiment, the silicon-containing film 308 has a porogenic compound deposited therein.

Figure 3G:
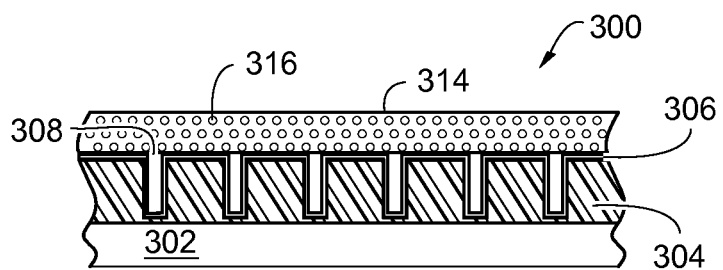

FIG. 3G shows the silicon-containing film 312 and the carbon containing material stack 311 after a cure process. The cure, described more clearly below, volatilizes the porogenic compounds in the silicon-containing film 312 and the carbon containing material stack 311, leaving behind pores 316 and removing the carbon containing material stack 311 from the features 308. The openings (e.g., pores 316 and the emptying of the features 308) created during the cure process decrease the k value of the overall layer.

Figure 4:
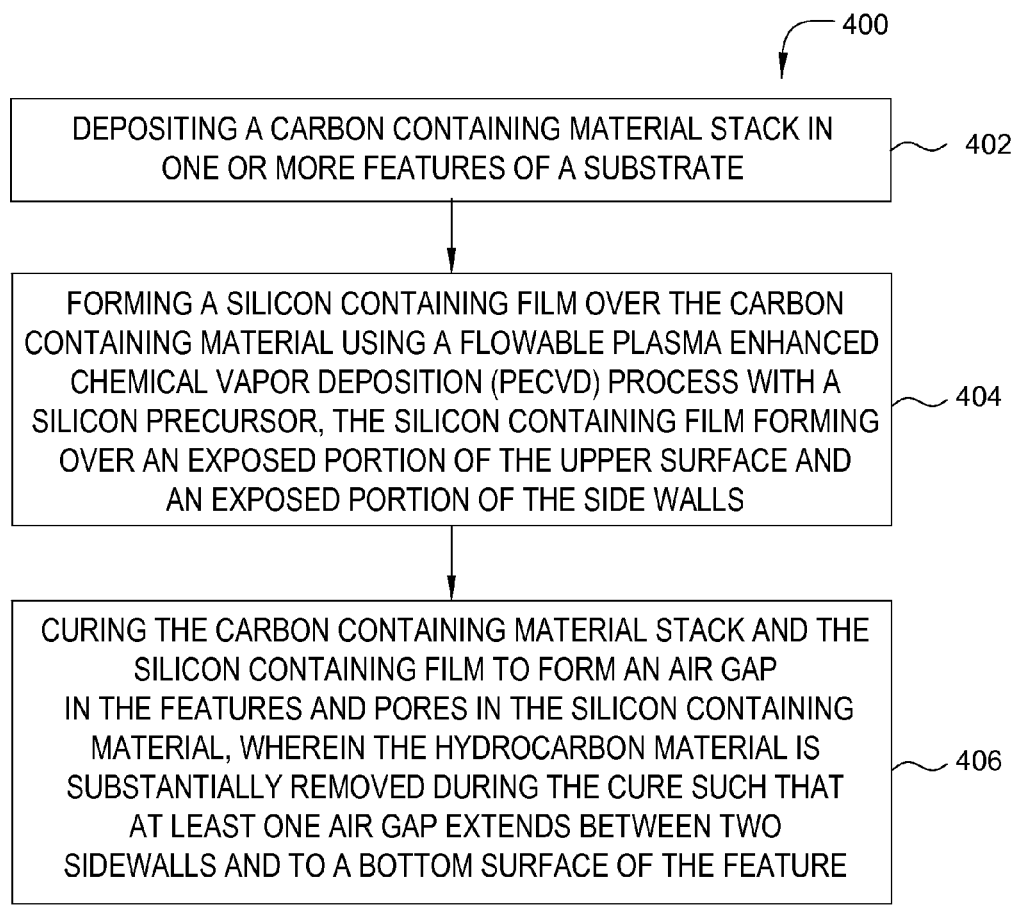
FIG. 4 is a block diagram of a method of forming the low k film according to one embodiment.

FIG. 4 is a method 400 of forming an air gap low k layer, according to embodiments described herein. The method 400 includes depositing a carbon containing material stack in one or more features of a substrate, at 402; forming a silicon containing film over the carbon containing material using a flowable plasma enhanced chemical vapor deposition (PECVD) process with a silicon precursor, the silicon containing film forming over an exposed portion of the upper surface and an exposed portion of the side walls, at 404; and curing the carbon containing material and the silicon containing material to form an air gap in the features and pores in the silicon containing material, wherein the carbon containing material is substantially removed during the cure such that at least one of the air gaps between two sides walls and to a bottom surface of the feature, at 406.

A carbon containing material stack is deposited into one or more features of a substrate, at 402. The carbon-containing material stack is a stack of carbon containing materials which will ultimately be deposited into the features formed on the substrate. The carbon containing material will be deposited using at least one carbon containing precursor. The carbon containing precursor can include an internal acetylene or ethylene molecule, each carbon of which is bound to either a primary, secondary or tertiary alkyl group. In this embodiment, the carbon containing precursor has the general formula R1(R2)-C=C—(R3)R4 or R1-C≡C—R2, where each of R1, R2, R3, and R4 can be atomic hydrogen, a primary alkyl group, a secondary alkyl group, or a tertiary alkyl group. The carbon containing precursor can also include a saturated or unsaturated ring structure with attached functional groups as described above. The carbon containing precursor can also include carbon-containing molecule with a carbonyl, aldehyde, acetate, amine and amide functional group. The carbon containing material can be deposited using an RF plasma, where the RF power is between 50 W and 500 W, for a 300 mm diameter substrate. The process chamber can be maintained at a temperature of between about 25 degrees Celsius and 400 degrees Celsius. The carbon containing precursor can be mixed with a reaction precursor to create a deposition gas. The reaction precursor can be an inert gas, such as Ar or He, or an oxidizing gas, such as $O_2$.

One or more of the precursors can be activated to deposit a carbon containing material from the deposition gas. The deposition gas mixture or components thereof can be activated using power sources capable of forming ionized and radical species from the reactant gas mixture. In one example, the power source is an RF power source. The RF power source can produce a plasma from one or more of the precursors which comprise the deposition gas. The RF power can be maintained at between 50 W and 500 W for a 300 mm diameter substrate. During the deposition process, the process chamber can be maintained at a temperature of between about 25 degrees Celsius and 400 degrees Celsius.

In some embodiments, the precursors are not mixed before being introduced to the deposition chamber. The precursors may enter the chamber through spatially separated precursor inlets distributed around reaction chamber. For example, the oxidizing precursor may enter from an inlet (or inlets) at the top of the chamber and positioned directly above the substrate. The inlet(s) may direct the flow of the oxidizing precursor in a direction perpendicular to the substrate deposition surface. Meanwhile, the carbon containing precursor may enter from one or more inlets around the sides of the deposition chamber. The inlets may direct the flow of the carbon containing precursor in a direction approximately parallel to the deposition surface.

The activated precursors react in the deposition chamber to form the carbon containing material layer on the substrate deposition surface. During the initial deposition, the substrate may be held a constant and relatively low temperature (e.g., about 30° C. to about 70° C.). The initial carbon containing material layer has excellent flowability, and can quickly migrate to the bottoms of the features in or on the substrate surface.

The carbon containing material is deposited conformally over an upper surface of a substrate and into the one or more features formed on the substrate. The one or more features are formed on either the substrate or a layer which is formed on the substrate, the features having side walls, a bottom surface. The carbon containing material is formed over the upper surface, the side walls and the bottom surface creating a largely conformal layer which flows together to fill in the bottom surface of the feature.

The carbon containing material is then stripped from the upper surface and the side walls. The stripping procedure includes delivering a reactant gas mixture to the substrate comprising an oxidizing gas, such as $O_2$ or $O_3$, and a carrier gas, such as Ar or He. The reactant gas mixture can be activated using e-beam, UV radiation, plasma or other power sources capable of forming ionized and radical species from the reactant gas mixture. During the stripping process, the process chamber can be maintained at a temperature of between about 25 degrees Celsius and 400 degrees Celsius. The stripping process will remove the deposited carbon containing material on the upper portion of the sidewalls and the upper portion of the substrate in a uniform fashion.

Next, the deposition of the carbon containing material and the stripping of the carbon-containing material can be repeated to create a carbon containing material stack. The deposition step will increase the bottom fill of the carbon containing material incrementally while the stripping step removes carbon containing material from undesired regions of the substrate. Though the stripping is largely uniform to the exposed regions of the carbon containing material layer, the flowable nature of the carbon containing material causes the carbon containing material layer to accumulate to a larger degree in the features as opposed to on other surfaces Without intending to be bound by theory, it is believed that a cyclical deposition process can more effectively fill the features formed in or on the substrate. During a single deposition cycle, the deposited layer forms conformally on all exposed surfaces. Due to the flowability of the layer, regions with recesses formed therein, such as features, may accumulate more deposition product. However, as deposition material accumulates, voids may form in the deposited layer. These voids reduce the ability of the deposited layer to control the deposition of subsequent layers which may increase the overall k value of the finished deposition product. Cyclical deposition allows for the incremental formation of the layer as a bottom fill while removing undesired deposition on the sidewalls and the upper portions of the substrate.

A silicon containing film is formed over the carbon containing material using a flowable plasma enhanced chemical vapor deposition (PECVD) process and a silicon-containing precursor, at 404. The silicon containing film can be formed over an exposed portion of the upper surface and an exposed portion of the side walls.

An exemplary method of forming a flowable silicon containing film includes providing a silicon precursor to a reaction chamber. The silicon precursor may include one or more carbon-containing organo-silicon compounds. The silicon precursor may also include a non-carbon containing silicon compound such as silane ($SiH_4$). Examples of organo-silicon precursors include dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, and phenylsilane, and mixtures thereof, among others. The non-carbon containing silicon precursors may be, for example, a silicon-and-nitrogen precursor, a silicon-and-hydrogen precursor, or a silicon-nitrogen-and-hydrogen containing precursor, among other classes of silicon precursors. Specific examples of these precursors may include silyl-amines such as $H_2N(SiH_3)$, $HN(SiH_3)_2$, and $N(SiH_3)_3$, among other silyl-amines. These silyl-amines may be mixed with additional gases that may act as carrier gases, reactive gases, or both. Examples of additional gases may include hydrogen, nitrogen, ammonia, helium, argon, among other gases. Examples of carbon-free silicon precursors may also include silane ($SiH_4$) either alone or mixed with other silicon-containing gases (e.g., $N(SiH_3)_3$), hydrogen-containing gases (e.g., $H_2$), and/or nitrogen-containing gases (e.g., $N_2$, $NH_3$).

The silicon precursor may be mixed with a carrier gas before or during its introduction to the deposition chamber. A carrier gas may be an inactive gas that does not unduly interfere with the formation of the oxide film on the substrate. Examples of carrier gases include helium, hydrogen, neon, argon, and nitrogen, among other gases.

An oxygen-containing precursor may also be introduced to the substrate containing reaction chamber. The oxygen containing precursor may include atomic oxygen remotely generated outside the deposition chamber. The atomic oxygen may be generated by the dissociation of a precursor such as molecular oxygen ($O_2$), ozone ($O_3$), a nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

The dissociation of the precursor to generate the atomic oxygen may also be done by thermal dissociation, ultraviolet light dissociation, and/or plasma dissociation, among other methods. Plasma dissociation may involve striking a plasma from helium, argon, etc., in a remote plasma generating chamber and introducing the oxygen precursor to the plasma to generate the atomic oxygen precursor. In one embodiment, the RF power, the temperature and the reaction gases In some embodiments, the precursors are not mixed before being introduced to the deposition chamber. The precursors may enter the chamber through spatially separated precursor inlets distributed around reaction chamber. For example, the atomic oxygen precursor may enter from an inlet (or inlets) at the top of the chamber and positioned directly above the substrate. The inlet(s) may direct the flow of the oxygen precursor in a direction perpendicular to the substrate deposition surface. Meanwhile, the silicon precursor may enter from one or more inlets around the sides of the deposition chamber. The inlets may direct the flow of the silicon precursor in a direction approximately parallel to the deposition surface.

The activated precursors react in the deposition chamber to form the silicon-containing film on the substrate deposition surface. During the initial deposition, the substrate may be held a constant and relatively low temperature (e.g., about 30° C. to about 70° C.). The initial oxide layer has excellent flowability, and can quickly migrate to the bottoms of the gaps left in the structures by the formation of the carbon containing material stack.

The carbon containing material stack and the silicon containing film can be cured to form an air gap in the features and pores in the silicon containing film, at 406. The cure can be performed using a thermal treatment, a UV treatment, an electron beam treatment (E-Beam) or others such that the energy for volatilization is delivered to the carbon-containing material stack and the silicon-containing film. The carbon containing material is substantially removed during the cure such that at least one air gap extends between two of the sides walls and to the bottom surface of the feature. The resulting porosity of the silicon containing film can be between about 5% and about 50%.

The previously described embodiments have many advantages. First, a cyclical deposition of the carbon-containing material stack allows for the incremental formation of the stack as a bottom fill while removing undesired deposition on the sidewalls and the upper portions of the substrate. Further, the effects of the carbon containing material, as formed on the upper surface of the second layer, on adhesion between subsequently deposited layers is avoided by cycled stripping steps. Finally, all steps can be performed in the same chamber thus reducing production time and costs. The aforementioned advantages are illustrative and not limiting. It is not necessary for all embodiments to have all the advantages.

While the foregoing is directed to embodiments of the disclosed devices, methods and systems, other and further embodiments of the disclosed devices, methods and systems may be devised without departing from the basic scope thereof, and the scope thereof is determined by the claims that follow.

What is claimed is:

1. A method of forming air gaps, comprising:
   depositing a carbon containing material stack in one or more features on a substrate, the stack deposition comprising:
      depositing a carbon containing material over the substrate, the substrate having:
         an upper surface; and
         the one or more features formed on or over the upper surface, the features having side walls, a bottom surface, wherein the carbon containing material is formed over the upper surface, the side walls and the bottom surface;
      stripping the carbon containing material from the upper surface and the side walls, wherein the carbon containing material remains on the bottom surface; and
      repeating the deposition of the carbon containing material and the stripping of the carbon containing material to create the carbon containing material stack on the bottom surface, the carbon containing material stack filling the features to a desired fill level;
   forming a silicon containing film over the carbon containing material stack using a flowable chemical vapor deposition (CVD) process with a silicon precursor, the silicon containing film forming over an exposed portion of the upper surface and an exposed portion of the side walls; and
   curing the carbon containing material stack and the silicon containing film to form the air gaps in the features and pores in the silicon containing film, wherein the hydrocarbon material is substantially removed during the cure such that at least one air gap extends between two of the sides walls and to the bottom surface of the feature.

2. The method of claim 1, wherein the silicon containing film is silicon nitride.

3. The method of claim 1, wherein the features are formed in a copper layer.

4. The method of claim 3, wherein the copper layer further comprises a barrier layer formed conformally on an upper surface of the copper layer.

5. The method of claim 1, wherein the depositing of the carbon containing material comprises:
   forming a plasma from an activation precursor; and
   combining the activation precursor with the carbon-containing precursor.

6. The method of claim 5, wherein the carbon containing precursor has the general formula (R1, R2)-C=C—(R3, R4) or R1-C≡C—R2.

7. The method of claim 6, wherein each of R1, R2, R3, and R4 are atomic hydrogen, a primary alkyl group, a secondary alkyl group, or a tertiary alkyl group.

8. The method of claim 1, wherein the carbon containing material is an amorphous carbon.

9. A method of forming air gaps, comprising:
   depositing a carbon containing material in one or more features on or over a substrate, the substrate having a conductive layer with an upper surface, the features being formed in the conductive layer and having sidewalls and a bottom surface;
   stripping the carbon containing material from the upper surface of the substrate, wherein the carbon containing material remains on the bottom surface and sidewalls of the features;
   repeating the depositing the carbon containing material and the stripping of the carbon containing material one or more times to create a carbon containing material stack in the features;
   forming a silicon nitride film over the upper surface of the substrate and the carbon containing material stack using a flowable chemical vapor deposition (CVD) process with a silicon precursor, the silicon nitride film forming over an exposed portion of the upper surface and an exposed portion of the side walls; and
   curing the carbon containing material stack and the silicon nitride film to form the air gaps in the features and pores in the silicon nitride film, creating a porous silicon nitride film, wherein the carbon containing material stack is substantially removed during the cure such that at least one of the air gaps extend from a first one of the adjacent raised features to a second one of the adjacent raised features.

10. The method of claim 9, wherein the conductive layer is a copper layer.

11. The method of claim 9, wherein the conductive layer further comprises a barrier layer formed conformally on an upper surface of the conductive layer.

12. The method of claim 9, wherein the depositing of the carbon containing material stack comprises:
   forming a plasma from an activation precursor; and
   combining the activation precursor with a carbon-containing precursor.

13. The method of claim 12, wherein the carbon containing precursor has the general formula (R1, R2)-C=C—(R3, R4) or R1-C≡C—R2.

14. The method of claim 13, wherein each of R1, R2, R3, and R4 are atomic hydrogen, a primary alkyl group, a secondary alkyl group, or a tertiary alkyl group.

15. The method of claim 9, wherein the carbon containing material is an amorphous carbon.

16. The method of claim 9, wherein the air gap and outside environment are fluidly connected through one or more pores of the porous silicon nitride layer.

* * * * *